United States Patent
Huang et al.

(10) Patent No.: US 9,269,749 B2
(45) Date of Patent: Feb. 23, 2016

(54) ORGANIC ELECTROLUMINESCENCE DISPLAY PANEL

(71) Applicant: Au Optronics Corporation, Hsinchu (TW)

(72) Inventors: Chih-An Huang, Yilan County (TW); Hung-Yi Chang, Taichung (TW); Pei-Ling Lin, Taichung (TW); Lun Tsai, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/324,250

(22) Filed: Jul. 7, 2014

(65) Prior Publication Data
US 2016/0005797 A1    Jan. 7, 2016

(51) Int. Cl.
*H01L 51/52* (2006.01)
*H01L 51/54* (2006.01)
*H01L 27/32* (2006.01)
*H01L 51/50* (2006.01)

(52) U.S. Cl.
CPC .......... *H01L 27/3209* (2013.01); *H01L 27/322* (2013.01); *H01L 51/504* (2013.01); *H01L 51/5206* (2013.01); *H01L 51/5218* (2013.01); *H01L 51/5221* (2013.01); *H01L 51/5234* (2013.01); *H01L 2251/558* (2013.01)

(58) Field of Classification Search
CPC ............. H01L 25/0753; H01L 51/5012; H01L 51/0081; H01L 51/50; H01L 51/5036; H01L 51/5203; H01L 51/5206; H01L 51/5209; H01L 51/5212; H01L 51/5215; H01L 51/5218; H01L 51/5221; H01L 27/3244; H01L 27/3246; H05B 33/14
USPC .................................................. 313/498–512
See application file for complete search history.

(56) References Cited

U.S. PATENT DOCUMENTS

| 6,639,250 B1 * | 10/2003 | Shimoda et al. ................. 257/98 |
| 8,426,847 B2 | 4/2013 | Nakamura et al. |
| 8,563,971 B2 | 10/2013 | Nakamura et al. |

(Continued)

FOREIGN PATENT DOCUMENTS

| CN | 101997086 | 3/2011 |
| CN | 102034850 | 4/2011 |

(Continued)

OTHER PUBLICATIONS

"International Search Report of PCT Counterpart Application" issued on Apr. 9, 2015, p. 1-p. 5.

*Primary Examiner* — Anne Hines
*Assistant Examiner* — Jose M Diaz
(74) *Attorney, Agent, or Firm* — Jianq Chyun IP Office

(57) ABSTRACT

An organic electroluminescence display panel that includes a plurality of first pixel areas, a plurality of second pixel areas, and a plurality of third pixel areas is provided. The organic electroluminescence display panel includes a first electrode layer, an organic layer including a light-emitting layer made of organic light-emitting material and a second electrode layer. The first electrode layer includes a reflective material. The organic layer is located on the first electrode layer. The second electrode layer is located on the organic layer. The material of the second electrode layer includes a transparent metal oxide conductive material. The thickness of the second electrode layer is a single thickness and is greater than 300 nm.

11 Claims, 8 Drawing Sheets

(56) References Cited

U.S. PATENT DOCUMENTS

| | | |
|---|---|---|
| 2004/0160154 A1* | 8/2004 | Nishimura et al. ............ 313/113 |
| 2005/0040756 A1* | 2/2005 | Winters et al. ................ 313/504 |
| 2005/0208332 A1* | 9/2005 | Chin et al. .................... 428/690 |
| 2005/0225232 A1* | 10/2005 | Boroson et al. ............... 313/504 |
| 2006/0082295 A1* | 4/2006 | Chin et al. .................... 313/506 |
| 2007/0057264 A1* | 3/2007 | Matsuda ......................... 257/88 |
| 2007/0205423 A1* | 9/2007 | Yamazaki et al. .............. 257/89 |
| 2008/0218071 A1* | 9/2008 | Kobayashi .................... 313/506 |
| 2010/0156280 A1 | 6/2010 | Song et al. |
| 2010/0163854 A1* | 7/2010 | Kho et al. ........................ 257/40 |
| 2011/0031480 A1 | 2/2011 | Nakamura et al. |
| 2012/0086332 A1* | 4/2012 | Matsui et al. ................. 313/506 |
| 2012/0176025 A1* | 7/2012 | Lee et al. ...................... 313/503 |
| 2012/0228596 A1* | 9/2012 | Fujita et al. ..................... 257/40 |
| 2013/0228761 A1 | 9/2013 | Nakamura et al. |
| 2013/0256639 A1* | 10/2013 | Kambe et al. ................... 257/40 |
| 2014/0183471 A1* | 7/2014 | Heo ................................ 257/40 |
| 2014/0191266 A1* | 7/2014 | Lee et al. ........................ 257/98 |
| 2014/0225100 A1* | 8/2014 | Yokoyama et al. ............. 257/40 |
| 2014/0284575 A1* | 9/2014 | Sugisawa et al. ............... 257/40 |
| 2014/0284576 A1* | 9/2014 | Sugisawa et al. ............... 257/40 |

FOREIGN PATENT DOCUMENTS

| | | |
|---|---|---|
| CN | 102610630 | 7/2012 |
| CN | 103050630 | 4/2013 |
| TW | 200526074 | 8/2005 |
| WO | 2014020850 | 2/2014 |

* cited by examiner

ORGANIC ELECTROLUMINESCENCE DISPLAY PANEL

BACKGROUND

1. Field

The invention relates to a display panel. More particularly, the invention relates to an organic electroluminescence display panel.

2. Description of Related Art

An organic electroluminescence display panel (e.g., an organic light emitting diode (OLED) display panel) characterized by active light emission, high contrast ratio, small thickness, and wide view angle is likely to become one of the mainstream new-generation flat panel displays.

In the organic electroluminescence display panel, a top emissive OLED can have high efficiency and high color saturation because the top emissive OLED achieves significant resonant cavity effects. For the purpose of accomplishing the resonant cavity effects, an organic layer including a light-emitting layer made of organic light-emitting material in the conventional organic electroluminescence display panel often requires the use of a fine metal mask (FMM) to adjust the light color and the light intensity of individual RGB sub-pixels.

Nevertheless, the FMM technique is not cost effective, and accurate alignment is indispensable to the FMM technique. More particularly, the distance between adjacent openings in the FMM has the upper limit, and the adjacent RGB sub-pixels need be spaced from each other, so as to prevent different color lights of the adjacent RGB sub-pixels from being mixed. In view of the above, an organic electroluminescence display panel that allows the number of times of using the FMM to be reduced, allows the manufacturing costs to be lowered down, and allows the manufacturing process to be simplified without negatively affecting the efficiency and the color saturation is in urgent need.

SUMMARY OF THE INVENTION

The invention is directed to an organic electroluminescence display panel that allows the number of times of using the FMM to be reduced, allows the manufacturing costs to be lowered down, and allows the manufacturing process to be simplified.

In the present embodiment, an organic electroluminescence display panel that includes a plurality of first pixel areas, a plurality of second pixel areas, and a plurality of third pixel areas is provided. The organic electroluminescence display panel includes a first electrode layer, an organic layer including a light-emitting layer made of organic light-emitting materi located on the first electrode layer al, and a second electrode layer. The first electrode layer includes a reflective material. The second electrode layer is located on the organic layer. A material of the second electrode layer includes a transparent metal oxide conductive material. A thickness of the second electrode layer is a single thickness and is substantially greater than 300 nm.

In view of the above, the material of the second electrode layer in the organic electroluminescence display panel described herein includes the transparent metal oxide conductive material. In comparison with the thin metal material applied to form the conventional electrode layer, the transparent metal oxide conductive material is characterized by high transparency even though the thickness of the material may be large. Hence, through adjustment of the thickness of the second electrode layer, the required individual optical thickness of each pixel area in the organic electroluminescence display panel may collectively comply with the wavelengths of the red light, the green light, and the blue light. As such, the organic electroluminescence display panel can have satisfactory efficiency and color saturation. Moreover, through the adjustment of the thickness of the second electrode layer, the number of times of using the FMM in the organic electroluminescence display panel may be reduced, so as to reduce the production costs and simplify the manufacturing process.

Several exemplary embodiments accompanied with figures are described in detail below to further describe the invention in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Figure 1A:
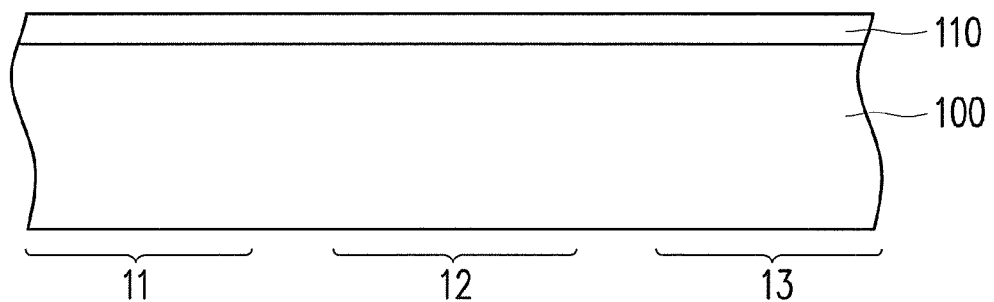
FIG. 1A to FIG. 1F are schematic cross-sectional flow charts illustrating a manufacturing process of an organic electroluminescence display panel according to a first embodiment of the invention.

FIG. 1A to FIG. 1F are schematic cross-sectional flow charts illustrating a manufacturing process of an organic electroluminescence display panel according to a first embodiment of the invention. FIG. 2 is a schematic top view illustrating the device layer depicted in FIG. 1A. With reference to FIG. 1A, a device layer 110 is formed on a substrate 100. Here, the substrate 100 is a rigid substrate (e.g., a glass substrate) or a flexible substrate (e.g., a plastic substrate). The substrate 100 may be made of a transparent material or a non-transparent material. Besides, the substrate 100 mainly serves to carry light emitting devices of the organic electroluminescence display panel. Note that the substrate 100 includes a plurality of first pixel areas 11, a plurality of second pixel areas 12, and a plurality of third pixel areas 13, and these pixel areas 11, 12, and 13 respectively display different primary colors of light. To clearly illustrate the invention, FIG. 1A shows one first pixel area 11, one second pixel area 12, and one third pixel area 13. The device layer 110 may include a plurality of thin film transistors (TFTs), capacitor, and other driver devices, which should not be construed as limitations to the invention. FIG. 2 is a schematic top view illustrating the device layer 110 depicted in FIG. 1A. The device layer 110 has a plurality of pixel structures P together constituting a pixel array. Note that 3×3 pixel structures P are shown in FIG. 2 for illustrative purposes. According to the present embodiment, the pixel array includes a plurality of scan lines SL, a plurality of data lines DL, and a plurality of power lines PL.

Each of the first, second, and third pixel areas 11, 12, and 13 has a pixel structure P therein. Each pixel structure P is electrically connected to one corresponding scan line SL, one corresponding data line DL, and one corresponding power line PL. According to the present embodiment, each pixel structure P has active devices T1 and T2 and a capacitor CS. In the present embodiment, each pixel structure P is the 2T1C structure (two active devices and one capacitor), for instance, whereas the invention is not limited thereto. In the 2T1C-type pixel structure, each of the active devices T1 and T2 has a gate, a source, a drain, and a channel region.

Figure 1B:
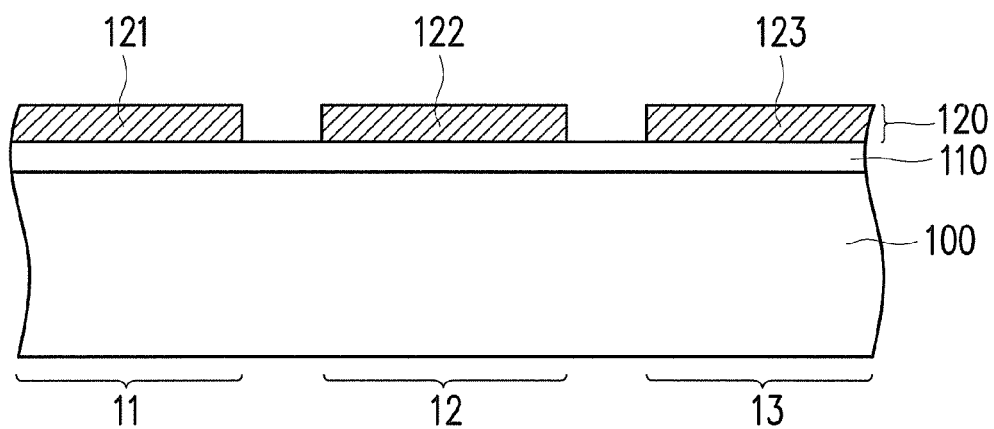
Figure 2:
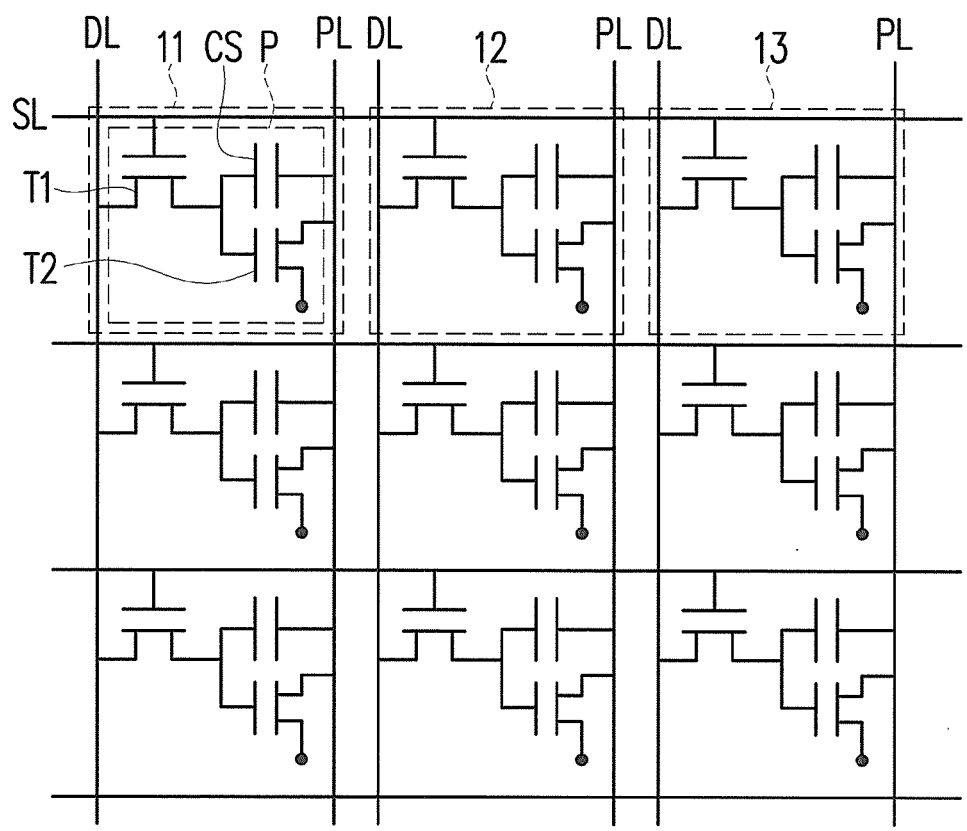
FIG. 2 is a schematic top view illustrating the device layer depicted in FIG. 1A.

With reference to FIG. 1B, a first electrode layer 120 is formed on the substrate 100. The electrode patterns 121, 122, and 123 are respectively located in the first, second, and third pixel areas 11, 12, and 13. The first electrode layer 120 may be formed by performing an evaporation process with use of FFMs, which should however not be construed as a limitation to the invention. For instance, the first electrode layer 120 may be formed by performing a lithography etching process together with a chemical vapor deposition (CVD) process or a physical vapor deposition (PVD) process. In the present embodiment, the organic electroluminescence display panel 10 is a top emissive organic electroluminescence display panel; in this case, the first electrode layer 120 may include a reflective material which is a conductive material (e.g., metal, alloy, metal oxide, and so on) or a stacked layer containing metal and a transparent metal oxide conductive material. Here, the transparent metal oxide conductive material is, for instance, indium tin oxide (ITO), indium zinc oxide (IZO), aluminum tin oxide (ATO), aluminum zinc oxide (AZO), indium germanium zinc oxide (IGZO), or any other appropriate oxide; however, the invention is not limited thereto.

Figure 1C:
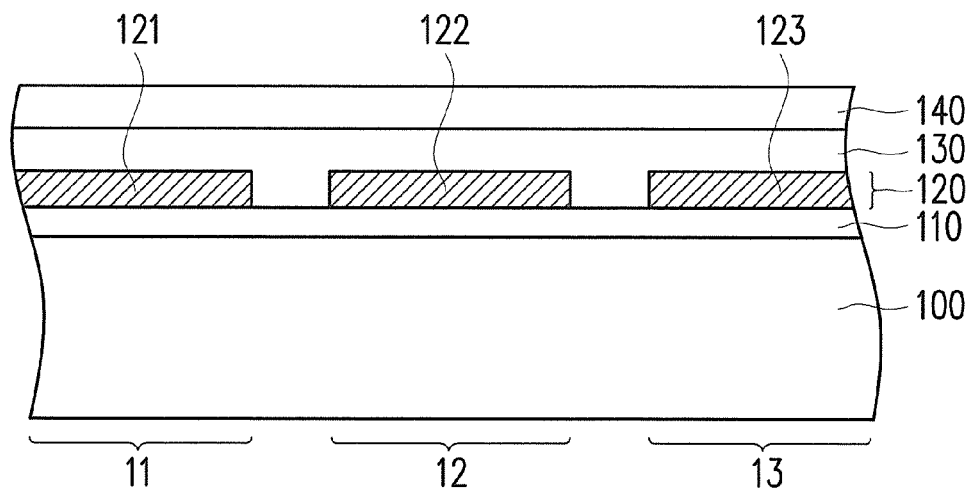

As shown in FIG. 1C, a hole injection layer (HIL) 130 and a hole transport layer (HTL) 140 are sequentially formed on the first electrode layer 120. The HIL 130 and the HTL 140 are formed by evaporation, for instance; however, the invention is not limited thereto. Note that the HIL 130 and the HTL 140 have the substantially the same thickness and height in the first, second, and third pixel areas 11, 12, and 13.

Figure 1D:
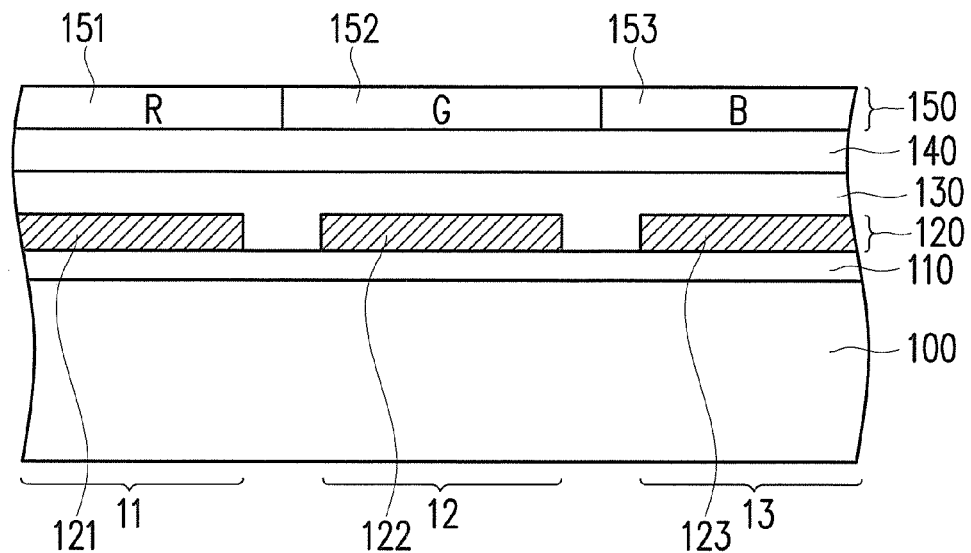

As shown in FIG. 1D, a light emitting layer 150 is formed on the HTL 140; specifically, light emitting layers 151, 152, and 153 are respectively formed in the first, second, and third pixel areas 11, 12, and 13 so as to form the light emitting layer 150. For instance, the light emitting layers 151, 152, and 153 may be respectively formed by performing an evaporation process with use of first, second, and third FMMs, which should however not be construed as a limitation to the invention. The light emitting layer 151 includes a first color light emitting material, the light emitting layer 152 includes a second color light emitting material, and the light emitting layer 153 includes a third color light emitting material. According to the present embodiment, the first color light emitting material is a red light emitting material R, the second color light emitting material is a green light emitting material G, and the third color light emitting material is a blue light emitting material B, which should not be construed as limitations to the invention. As shown in FIG. 1D, the first color light emitting material is in the first pixel area 11, the second color light emitting material is in the second pixel area 12, and the third color light emitting material is in the third pixel area 13.

Figure 1E:
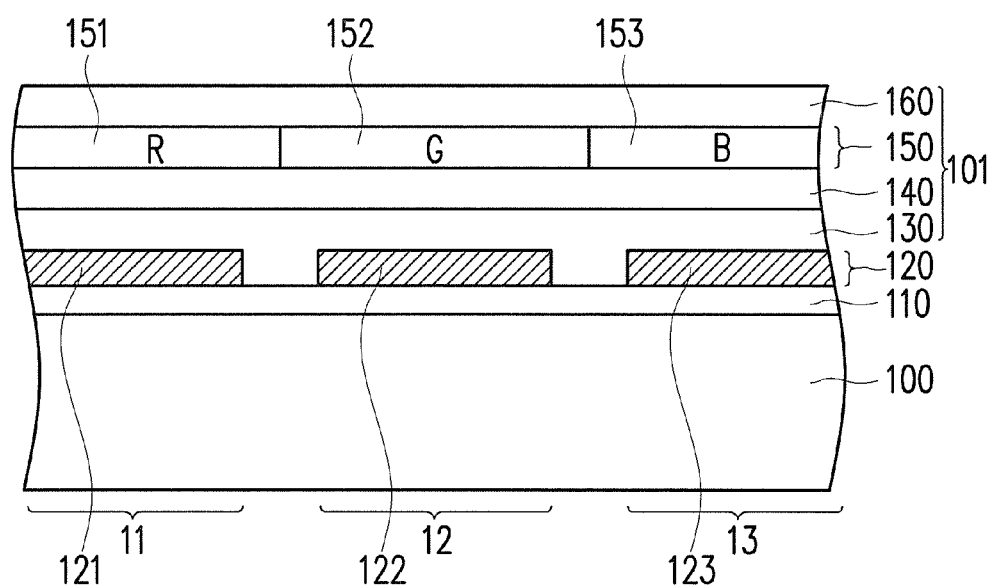

With reference to FIG. 1E, an electron transport layer (ETL) 160 is formed on the light emitting layer 150. The ETL 160 is formed by performing an evaporation process, for instance; however, the invention is not limited thereto. Note that the ETL 160 has the substantially the same thickness and height in the first, second, and third pixel areas 11, 12, and 13.

In this embodiment, the hole injection layer (HIL) 130, the hole transport layer (HTL) 140, the light emitting layer 150 and the electron transport layer (ETL) 160 form an organic layer 101. The organic layer 101 is located on the first electrode layer 120.

Figure 1F:
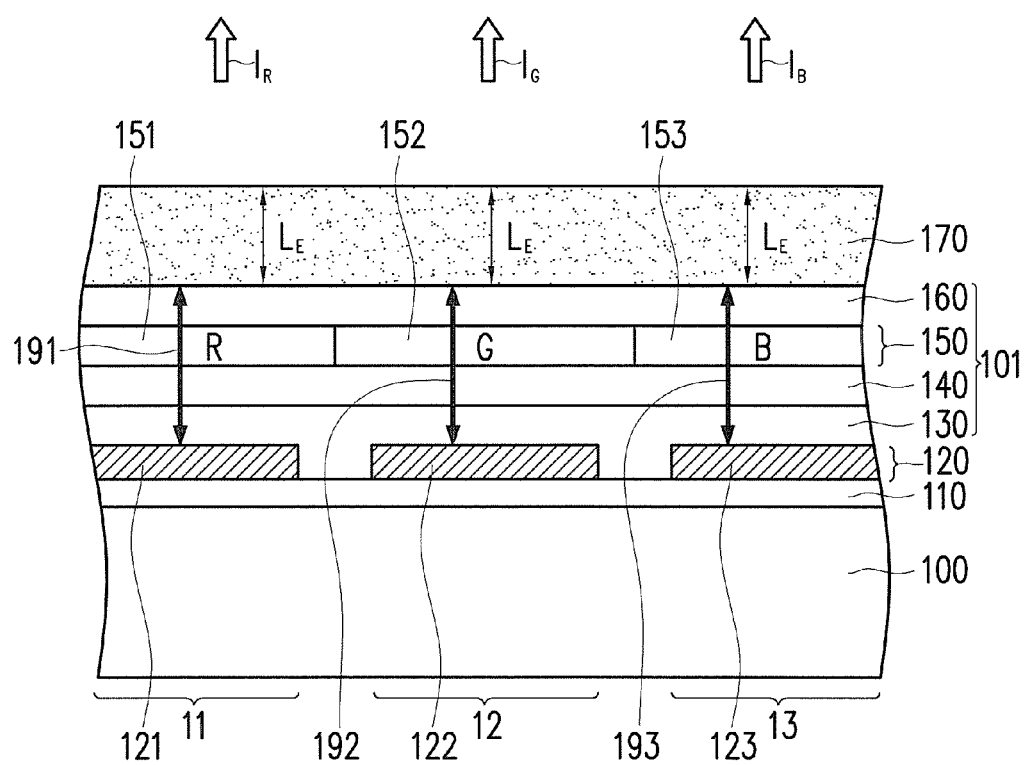

As shown in FIG. 1F, a second electrode layer 170 is formed on the ETL 160, so as to complete the fabrication of the organic electroluminescence display panel 10 described herein. A material of the second electrode layer 170 includes a transparent metal oxide conductive material, e.g., ITO, IZO, AZO, ATO, IGZO, other appropriate oxide, or a stacked layer having at least two of the above-mentioned materials; however, the invention is not limited thereto. If necessary, a polarizer, a cover plate, or other components may be formed on the second electrode layer 170, which should not be construed as a limitation to the invention.

As shown in FIG. 1F and FIG. 2, the source of the active device T1 is electrically connected to the data line DL, the gate of the active device T1 is electrically connected to the scan line, and the drain of the active device T1 is electrically connected to the active device T2. The gate of the active device T2 is electrically connected to the drain of the active device T1, the source of the active device T2 is electrically connected to the power line PL, and the drain of the active device T2 is electrically connected to the first electrode layer 120. One electrode terminal of the capacitor CS is electrically connected to the drain of the active device T1, and the other terminal of the capacitor CS is electrically connected to the source of the active device T2 and the power line PL.

In FIG. 1F, a micro resonant cavity 191 may be formed in the first pixel area 11 and between the electrode pattern 121 and the second electrode layer 170. Similarly, in the second pixel area 12, a micro resonant cavity 192 may be formed between the electrode pattern 122 and the second electrode layer 170; in the third pixel area 13, a micro resonant cavity 193 may be formed between the electrode pattern 123 and the second electrode layer 170. In general, the light emitted by the red, green, and blue light emitting materials R, G, and B may generate the resonant cavity effects in the micro resonant cavities 191, 192, and 193, respectively. Said light is then reacted with the reflective material in the first electrode layer 120 and is emitted toward the second electrode layer 170, and the first, second, and third pixel areas 11, 12, and 13 respectively emit red light $l_R$, green light $l_G$, and blue light $l_B$.

In a conventional organic electroluminescence display panel, five FMMs are required to achieve said resonant cavity effects, wherein two of the FMMs serve to evaporate the HTL with different thicknesses, so as to comply with the different optical thicknesses of the RGB sub-pixels. Nevertheless, the FMM technique is not cost effective, and accurate alignment is indispensable to the FMM technique. More particularly, the distance between adjacent openings in the FMM has the upper limit, and the adjacent RGB sub-pixels need be spaced from each other, so as to prevent lights emitted from the adjacent RGB sub-pixels with different colors from being mixed.

Compared to the thin metal material applied to form the conventional electrode layer, the transparent conductive oxide (TCO) provided herein for forming the second electrode layer 170 is characterized by high transparency even though the thickness of the material may be large (e.g., at least 50 nm). Therefore, according to the present embodiment, through adjustment of the thickness of the TCO of the second electrode layer 170, the individual optical thickness of each of the first, second, and third pixel areas 11, 12, and 13 may collectively comply with the wavelengths of the red light $l_R$, the green light $l_G$, and the blue light $l_B$. As depicted in FIG. 1F, in the micro resonant cavities 191, 192, and 193, film layers excluding the light emitting layers 151, 152, and 153 are formed with the substantially the same thickness. Thereby, the number of times of using the FMMs may be reduced.

Particularly, in the present embodiment, simulation software is applied to calculate the thickness of the second electrode layer 170. The thickness of the second electrode layer 170 above the first color light emitting material (i.e., the light emitting layer 151), the second color light emitting material (i.e., the light emitting layer 152), and the third color light emitting material (i.e., the light emitting layer 153) is $L_E$, and the thickness $L_E$ satisfies a formula (1):

$$m_R - 0.2 \leq \frac{\psi}{2\pi} + \frac{2(n_O L_O + n_E L_E)}{\lambda_R} + \frac{1}{2} \leq m_R + 0.2 \quad \text{formula (1)}$$

$$m_G - 0.2 \leq \frac{\psi}{2\pi} + \frac{2(n_O L_O + n_E L_E)}{\lambda_G} + \frac{1}{2} \leq m_G + 0.2$$

$$m_B - 0.2 \leq \frac{\psi}{2\pi} + \frac{2(n_O L_O + n_E L_E)}{\lambda_B} + \frac{1}{2} \leq m_B + 0.2$$

Here, $n_E$ represents a refractive index of the second electrode layer 170, and $\lambda_R$, $\lambda_G$, and $\lambda_B$ respectively represent a light emitting wavelength of the first, second, and third pixel areas 11, 12, and 13; in the present embodiment, $\lambda_R$, $\lambda_G$, and $\lambda_B$ respectively represent the wavelengths of the red light $l_R$, the green light $l_G$, and the blue light $l_B$. Besides, $\Psi$ represents a total amount of phase shift of light passing between the first electrode layer 120 and the second electrode layer 170, the phase shift is measured in radians, and $0 < \Psi \leq 2\Pi$. Moreover, $m_R$, $m_G$, and $m_B$ respectively represent a positive integer, and $m_R \leq m_G \leq m_B$; $n_O$ represents an average refractive index of the organic layer 101 including a electron transport layer (ETL) 160, athe light-emitting layer 150 made of organic light-emitting material, the hole transport layer (HTL) 140, and the hole injection layer (HIL) 130 140 150 160; LO represents the thickness of the organic layer 101 between the first electrode 120 and the second electrode 170.

The simulated results show that the individual optical thickness of each of the first, second, and third pixel areas 11, 12, and 13 may collectively comply with the wavelengths of the red light $l_R$, the green light $l_G$, and the blue light $l_B$ through obtaining the appropriate thickness with use of the formula (1), given that the thickness $L_E$ of the second electrode layer 170 is greater than 300 nm. Within said range, the thickness $L_E$ of the second electrode layer 170 above the first color light emitting material (i.e., the light emitting layer 151), the second color light emitting material (i.e., the light emitting layer 152), and the third color light emitting material (i.e., the light emitting layer 153) remains substantially unchanged. In light of the foregoing, the thickness of the second electrode layer 170 described in the present embodiment is a single thickness, and thus two FMMs for adjusting the thickness of the HTL can be omitted; thereby, the production costs of the organic electroluminescence display panel 10 can be lowered down, and the manufacturing process can be simplified.

If the thickness $L_E$ of the second electrode layer 170 is from about 300 nm to about 700 nm, favorable resonant cavity effects can be achieved, and the first, second, and third pixel areas 11, 12, and 13 may respectively emit red light $l_R$, green light $l_G$, and blue light $l_B$. Here, a wavelength of the red light $l_R$ is from about 590 nm to about 650 nm, a wavelength of the green light $l_G$ is from about 480 nm to about 540 nm, and a wavelength of the blue light $l_B$ is from about 420 nm to about 480 nm. Therefore, if the thickness of the second electrode layer 170 is within said range, the organic electroluminescence display panel 10 can simultaneously have satisfactory efficiency and color saturation.

In an Example, the wavelengths of the red light, green light, and blue light are respectively 620 nm, 520 nm, and 458 nm, and the refractive index of the second electrode layer $n_O$ and the average refractive index of the organic layer $n_E$ for the red light pixel area, the green light pixel area, and the blue light pixel area are shown in Table 1. In the Example, the thickness $L_E$ satisfies formula (1) for all of the three color light ranges from 455 nm to 490 nm (as shown in Table 2-1, $m_R$=5, $m_G$=6, $m_B$=7) and ranges from 590 nm to 600 nm (as shown in Table 2-2, $m_R$=6, $m_O$=7, $m_B$=8).

TABLE 1

|  | Wavelength (nm) | $n_O$ | $n_E$ |
|---|---|---|---|
| Red light | 620 | 1.78 | 2.03 |
| Green light | 520 | 1.8 | 2.08 |
| Blue light | 458 | 1.87 | 2.15 |

TABLE 2-1

| | The thickness $L_E$ (nm) | | | | | | | | | |
|---|---|---|---|---|---|---|---|---|---|---|
| | 450 | 455 | 460 | 465 | 470 | 475 | 480 | 485 | 490 | 495 |
| $\frac{\psi}{2\pi} + \frac{2(n_O L_O + n_E L_E)}{\lambda_R} + \frac{1}{2}$ | 4.908 | 4.940 | 4.973 | 5.006 | 5.039 | 5.071 | 5.104 | 5.137 | 5.170 | 5.202 |
| $\frac{\psi}{2\pi} + \frac{2(n_O L_O + n_E L_E)}{\lambda_G} + \frac{1}{2}$ | 5.844 | 5.884 | 5.924 | 5.964 | 6.004 | 6.044 | 6.084 | 6.124 | 6.164 | 6.204 |
| $\frac{\psi}{2\pi} + \frac{2(n_O L_O + n_E L_E)}{\lambda_B} + \frac{1}{2}$ | 6.767 | 6.814 | 6.861 | 6.908 | 6.955 | 7.002 | 7.049 | 7.096 | 7.143 | 7.190 |

TABLE 2-2

| | The thickness $L_E$ (nm) | | | | | | | | |
|---|---|---|---|---|---|---|---|---|---|
| | 560 | 565 | 570 | 575 | 580 | 585 | 590 | 595 | 600 |
| $\frac{\psi}{2\pi} + \frac{2(n_O L_O + n_E L_E)}{\lambda_R} + \frac{1}{2}$ | 5.628 | 5.661 | 5.693 | 5.726 | 5.759 | 5.792 | 5.824 | 5.857 | 5.890 |
| $\frac{\psi}{2\pi} + \frac{2(n_O L_O + n_E L_E)}{\lambda_G} + \frac{1}{2}$ | 6.724 | 6.764 | 6.804 | 6.844 | 6.884 | 6.924 | 6.964 | 7.004 | 7.044 |
| $\frac{\psi}{2\pi} + \frac{2(n_O L_O + n_E L_E)}{\lambda_B} + \frac{1}{2}$ | 7.800 | 7.847 | 7.894 | 7.941 | 7.988 | 8.035 | 8.082 | 8.129 | 8.176 |

The organic electroluminescence display panel provided in the invention is not limited to that described in the previous embodiment. With reference to the drawings, other organic electroluminescence display panels are provided in the following embodiments. To differentiate the embodiments and simplify the descriptions, the same or similar devices in the following embodiments are marked by the same or similar reference numbers; the differences among the embodiments will be further elaborated, while the similarities will be omitted.

Figure 3:
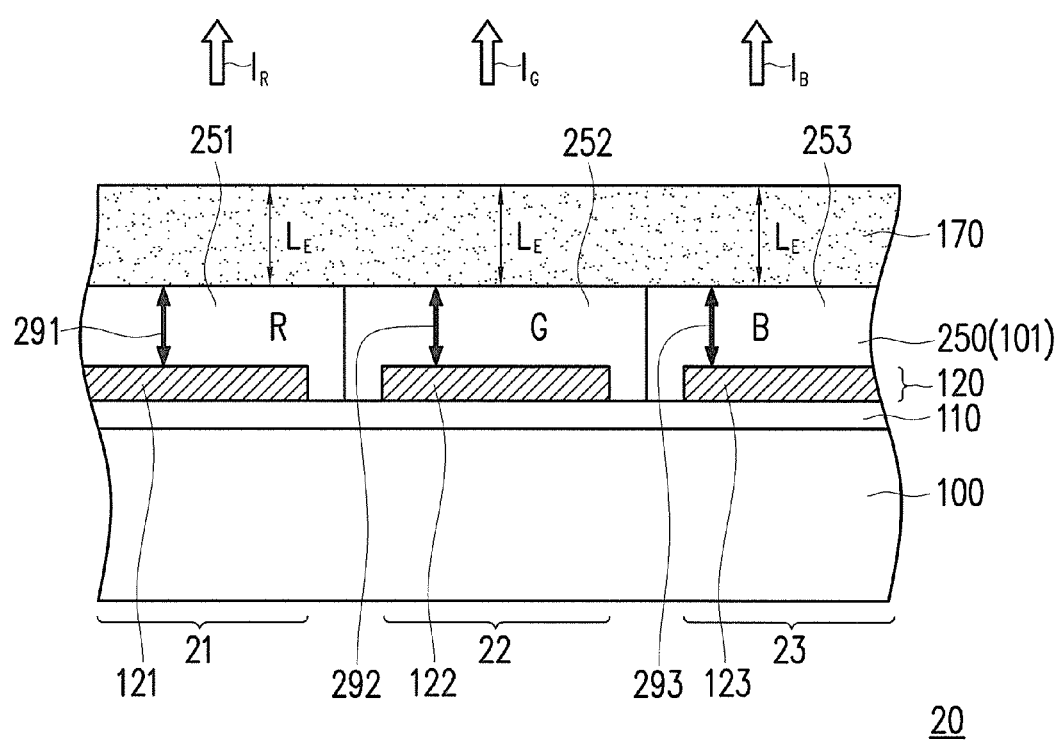
FIG. 3 is a schematic cross-sectional view illustrating an organic electroluminescence display panel according to a second embodiment of the invention.

FIG. 3 is a schematic cross-sectional view illustrating an organic electroluminescence display panel according to a second embodiment of the invention. The organic electroluminescence display panel 20 depicted in FIG. 3 is similar to the organic electroluminescence display panel 10 depicted in FIG. 1F, while the difference therebetween lies in that the light emitting layer 250 is directly formed on the first electrode layer 120, and the second electrode layer 170 is directly formed on the light emitting layer 250 according to the present embodiment. The organic layer 101 is formed of the light emitting layer 250. Similarly, the light emitting layers 251, 252, and 253 are respectively located in the first, second, and third pixel areas 21, 22, and 23. For instance, the light emitting layers 251, 252, and 253 may be respectively formed by performing an evaporation process with use of first, second, and third FMMs, which should however not be construed as a limitation to the invention. The light emitting layer 251 includes a first color light emitting material, the light emitting layer 252 includes a second color light emitting material, and the light emitting layer 253 includes a third color light emitting material. According to the present embodiment, the first color light emitting material is a red light emitting material R, the second color light emitting material is a green light emitting material G, and the third color light emitting material is a blue light emitting material B, which should not be construed as limitations to the invention.

Similarly, a micro resonant cavity 291 may be formed in the first pixel area 21 and between the electrode pattern 121 and the second electrode layer 170. Besides, in the second pixel area 22, a micro resonant cavity 292 may be formed between the electrode pattern 122 and the second electrode layer 170; in the third pixel area 23, a micro resonant cavity 293 may be formed between the electrode pattern 123 and the second electrode layer 170. In general, the light emitted by the red, green, and blue light emitting materials R, G, and B may generate the resonant cavity effects in the micro resonant cavities 291, 292, and 293, respectively. Said light is then reacted with the reflective material in the first electrode layer 120 and is emitted toward the second electrode layer 170, and the first, second, and third pixel areas 21, 22, and 23 respectively emit red light $l_R$, green light $l_G$, and blue light $l_B$.

Compared to the thin metal material applied to form the conventional electrode layer, the TCO provided herein for forming the second electrode layer 170 is characterized by high transparency even though the thickness of the material may be large (e.g., at least 50 nm). Therefore, according to the present embodiment, through adjustment of the thickness of the TCO of the second electrode layer 170, the individual optical thickness of each of the first, second, and third pixel areas 21, 22, and 23 may collectively comply with the wavelengths of the red light $l_R$, the green light $l_G$, and the blue light $l_B$. As depicted in FIG. 3, in the micro resonant cavities 291, 292, and 293, film layers excluding the light emitting layers 251, 252, and 253 are formed with the substantially the same thickness. Thereby, the number of times of using the FMMs may be reduced.

Particularly, in the present embodiment, simulation software is applied to calculate the thickness of the second electrode layer 170. The thickness of the second electrode layer 170 above the first color light emitting material (i.e., the light emitting layer 251), the second color light emitting material (i.e., the light emitting layer 252), and the third color light emitting material (i.e., the light emitting layer 253) is $L_E$. The simulated results show that the individual optical thickness of each of the first, second, and third pixel areas 21, 22, and 23 may collectively comply with the wavelengths of the red light $l_R$, the green light $l_G$, and the blue light $l_B$ through obtaining the appropriate thickness with use of the formula (1), given that the thickness $L_E$ of the second electrode layer 170 is greater than 300 nm. Within said range, the thickness $L_E$ of the second electrode layer 170 above the first color light emitting material (i.e., the light emitting layer 251), the second color light emitting material (i.e., the light emitting layer 252), and the third color light emitting material (i.e., the light emitting layer 253) remains substantially unchanged. In light of the foregoing, the thickness of the second electrode layer 170 described in the present embodiment is a single thickness, and film layers (in the OLED) excluding the light emitting layers 251, 252, and 253 may be formed with the same thickness; therefore, the number of times of using the FMMs can be reduced, the production costs of the organic electroluminescence display panel 20 can be lowered down, and the manufacturing process can be simplified.

If the thickness $L_E$ of the second electrode layer 170 is from about 300 nm to about 700 nm, favorable resonant cavity effects can be achieved, and the first, second, and third pixel areas 21, 22, and 23 may respectively emit red light $l_R$, green light $l_G$, and blue light $l_B$. Here, a wavelength of the red light $l_R$ is from about 590 nm to about 650 nm, a wavelength of the green light $l_G$ is from about 480 nm to about 540 nm, and a wavelength of the blue light $l_B$ is from about 420 nm to about 480 nm. Therefore, if the thickness of the second electrode layer 170 is within said range, the organic electroluminescence display panel 20 can simultaneously have satisfactory efficiency and color saturation.

Figure 4:
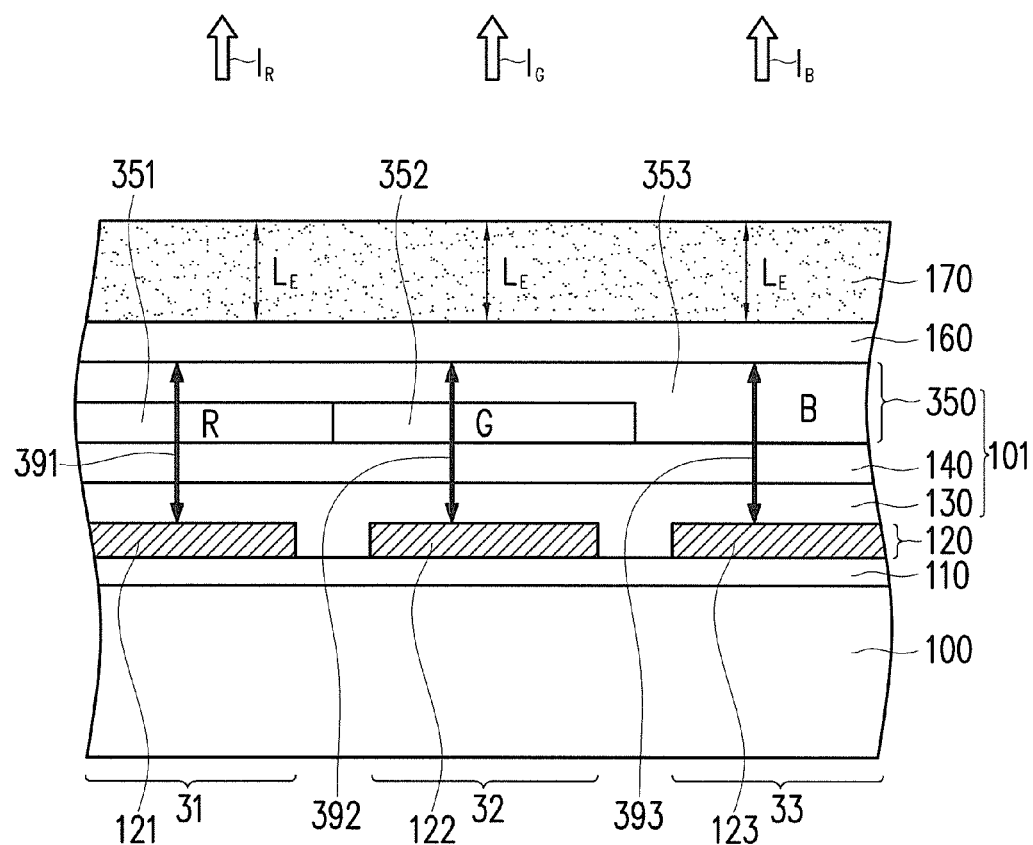
FIG. 4 is a schematic cross-sectional view illustrating an organic electroluminescence display panel according to a third embodiment of the invention.

FIG. 4 is a schematic cross-sectional view illustrating an organic electroluminescence display panel according to a third embodiment of the invention. The organic electroluminescence display panel 30 depicted in FIG. 4 is similar to the organic electroluminescence display panel 10 depicted in FIG. 1F, while the difference therebetween lies in that the organic layer 101 includes the light emitting layer 350, and the distribution of the color light emitting materials in the light emitting layer 350 is different. With reference to FIG. 4, the light emitting layer 350 includes light emitting layers 351, 352, and 353 respectively located in the first, second, and third pixel areas 31, 32, and 33, and the light emitting layer 353 covers the light emitting layers 351 and 352. According to the present embodiment, the first color light emitting material is a red light emitting material R, the second color light emitting material is a green light emitting material G, and the third color light emitting material is a blue light emitting material B, which should not be construed as limitations to the invention.

Similarly, a micro resonant cavity 391 may be formed in the first pixel area 31 and between the electrode pattern 121 and the second electrode layer 170. Besides, in the second pixel area 32, a micro resonant cavity 392 may be formed between the electrode pattern 122 and the second electrode layer 170; in the third pixel area 33, a micro resonant cavity 393 may be formed between the electrode pattern 123 and the second electrode layer 170. In general, the light emitted by the red, green, and blue light emitting materials R, G, and B may generate the resonant cavity effects in the micro resonant cavities 391, 392, and 393, respectively. Said light is then reacted with the reflective material in the first electrode layer 120 and is emitted toward the second electrode layer 170, and the first, second, and third pixel areas 31, 32, and 33 respectively emit red light $1_R$, green light $1_G$, and blue light $1_B$.

Compared to the thin metal material applied to form the conventional electrode layer, the TCO provided herein for forming the second electrode layer 170 is characterized by high transparency even though the thickness of the material may be large (e.g., at least 50 nm). Therefore, according to the present embodiment, through adjustment of the thickness of the TCO of the second electrode layer 170, the individual optical thickness of each of the first, second, and third pixel areas 31, 32, and 33 may collectively comply with the wavelengths of the red light $1_R$, the green light $1_G$, and the blue light $1_B$. As depicted in FIG. 4, in the micro resonant cavities 391, 392, and 393, film layers excluding the light emitting layers 351, 352, and 353 are formed with the substantially the same thickness. Thereby, the number of times of using the FMMs may be reduced.

Particularly, in the present embodiment, simulation software is applied to calculate the thickness of the second electrode layer 170. The thickness of the second electrode layer 170 above the first color light emitting material (i.e., the light emitting layer 351), the second color light emitting material (i.e., the light emitting layer 352), and the third color light emitting material (i.e., the light emitting layer 353) is $L_E$. The simulated results show that the individual optical thickness of each of the first, second, and third pixel areas 31, 32, and 33 may collectively comply with the wavelengths of the red light $1_R$, the green light $1_G$, and the blue light $1_B$, given that the thickness $L_E$ of the second electrode layer 170 is greater than 300 nm. Within said range, the thickness $L_E$ of the second electrode layer 170 above the first color light emitting material (i.e., the light emitting layer 351), the second color light emitting material (i.e., the light emitting layer 352), and the third color light emitting material (i.e., the light emitting layer 353) remains substantially unchanged. The thickness of the second electrode layer 170 described in the present embodiment is a single thickness, and thus two FMMs for adjusting the thickness of the HTL can be omitted. Besides, since the third light emitting layer 353 is in the third pixel areas 33 and covers the first and second light emitting layers 351 and 352 to collectively form the blue light emitting layer, one more FMM may be reduced. In light of the foregoing, the thickness of the second electrode layer 170 described in the present embodiment is a single thickness, and thus the number of times of using the FMMs may be reduced; thereby, the production costs of the organic electroluminescence display panel 30 can be lowered down, and the manufacturing process can be simplified.

If the thickness $L_E$ of the second electrode layer 170 is from about 300 nm to about 700 nm, favorable resonant cavity effects can be achieved, and the first, second, and third pixel areas 31, 32, and 33 may respectively emit red light $1_R$, green light $1_G$, and blue light $1_B$. Here, a wavelength of the red light $1_R$ is from about 590 nm to about 650 nm, a wavelength of the green light $1_G$ is from about 480 nm to about 540 nm, and a wavelength of the blue light $1_B$ is from about 420 nm to about 480 nm. Therefore, if the thickness of the second electrode layer 170 is within said range, the organic electroluminescence display panel 30 can simultaneously have satisfactory efficiency and color saturation.

Figure 5:
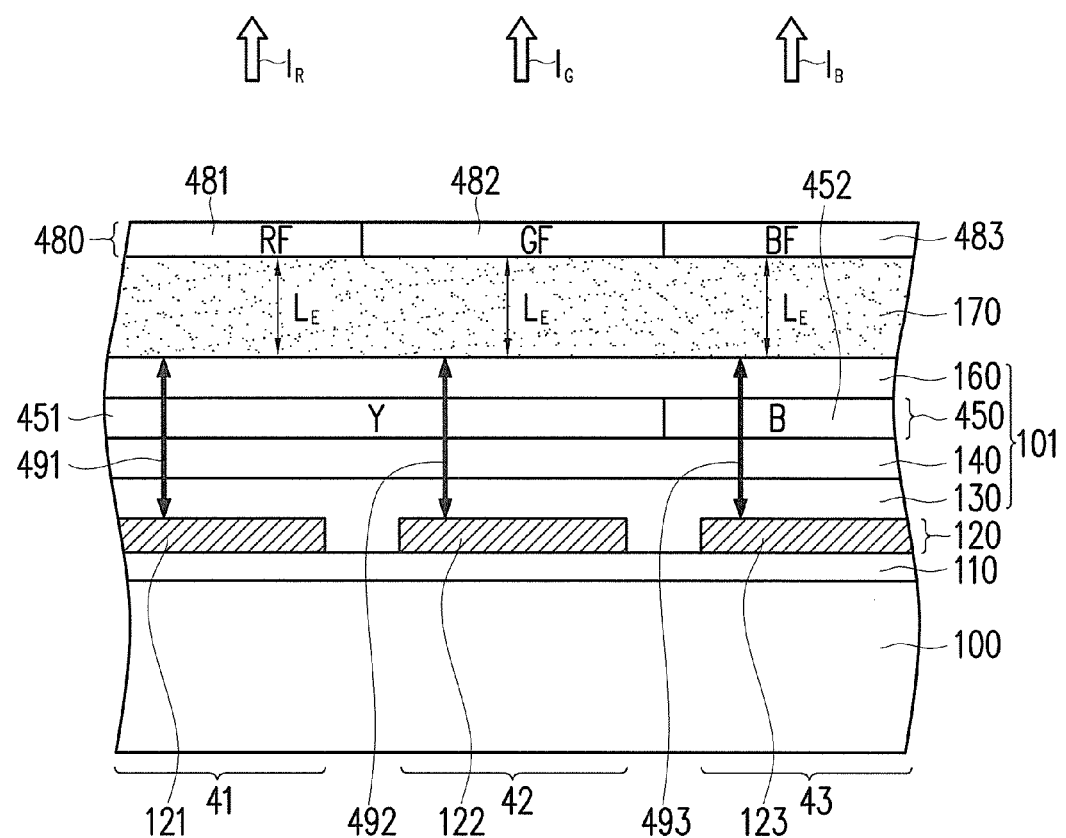
FIG. 5 is a schematic cross-sectional view illustrating an organic electroluminescence display panel according to a fourth embodiment of the invention.

FIG. 5 is a schematic cross-sectional view illustrating an organic electroluminescence display panel according to a fourth embodiment of the invention. The organic electroluminescence display panel 40 depicted in FIG. 5 is similar to the organic electroluminescence display panel 10 depicted in FIG. 1F, while the difference therebetween lies in that the organic layer 101 includes the light emitting layer 450, and the distribution and the composition of the color light emitting materials in the light emitting layer 450 are different. With reference to FIG. 5, the light emitting layer 450 is formed by the light emitting layers 451 and 452 that are juxtaposed (arranged in a side-by-side manner). Similarly, the light emitting layer 451 is in the first and second pixel areas 41 and 42, and the light emitting layer 452 is in the third pixel areas 43. The light emitting layer 451 includes a first color light emitting material, and the light emitting layer 452 includes a second color light emitting material. According to the present embodiment, the first and second color light emitting materials are the yellow light emitting material Y and the blue light emitting material B, respectively, while the invention is not limited thereto. Note that the organic electroluminescence display panel 40 described in the present embodiment further includes a color filter layer 480 located on the second electrode layer 170. The color filter layer 480 includes a third color filter material 481, a fourth color filter material 482, and a second color filter material 483. The third, fourth, and second color filter materials 481, 482, and 483 are respectively in the first, second, and third pixel areas 41, 42, and 43. According to the present embodiment, the second, third, and fourth color filter materials 483, 481, and 482 are blue, red, and green filter materials BF, RF, and GF, respectively, and the second color filter material 483 (i.e., the blue filter material BF) may be omitted. The red and green filter materials RF and GF can filter out the light emitted by the yellow light emitting material Y, so as to generate the red light $1_R$ and the green light $1_G$. If necessary, a polarizer, an anti-reflection layer, a cover plate, or other components may be formed on the color filter layer 480, which should not be construed as a limitation to the invention.

Similarly, in the present embodiment, simulation software is applied to calculate the thickness of the second electrode layer 170. The thickness of the second electrode layer 170 above the first, second and third pixel areas 41, 42, and 43 is $L_E$. The simulated results show that the individual optical thickness of each of the first, second, and third pixel areas 41, 42, and 43 may collectively comply with the wavelengths of the red light $1_R$, the green light $1_G$, and the blue light $1_B$, given that the thickness $L_E$ of the second electrode layer 170 is greater than 300 nm. As shown in FIG. 5, the micro resonant cavities 491, 492, and 493 may have substantially the same length. Thereby, the number of times of using the FMMs may be reduced. Within said range, the thickness of the second electrode layer 170 above the organic light emitting layers 451 and 452 may remain substantially the same. Since the thickness of the second electrode layer 170 described in the present embodiment is a single thickness, two FMMs for adjusting the thickness of the HTL can be omitted. In addition, the organic light emitting layers 450 having the yellow light emitting material Y is configured, and the red and green filter materials RF and GF are applied to filter out the red light and the green light, so as to reduce one more FMM. As such, the production costs of the organic electroluminescence display panel 40 may be lowered down, and the manufacturing process can be simplified.

If the thickness $L_E$ of the second electrode layer 170 is from about 300 nm to about 700 nm, favorable resonant cavity effects can be achieved, and the first, second, and third pixel areas 41, 42, and 43 may respectively emit red light, green light, and blue light. Here, a wavelength of the red light is from about 590 nm to about 650 nm, a wavelength of the green light is from about 480 nm to about 540 nm, and a wavelength of the blue light is from about 420 nm to about 480 nm. Therefore, if the thickness of the second electrode layer 170 is within said range, the organic electroluminescence display panel 40 can simultaneously have satisfactory efficiency and color saturation.

To sum up, the material of the second electrode layer in the organic electroluminescence display panel described herein includes the transparent metal oxide conductive material. In comparison with the thin metal material applied to form the conventional electrode layer, the transparent metal oxide conductive material is characterized by high transparency even though the thickness of the material may be large. Hence, through adjustment of the thickness of the second electrode layer, the required individual optical thickness of each pixel area in the organic electroluminescence display panel may collectively comply with the wavelengths of the red light, the green light, and the blue light. As such, the organic electroluminescence display panel can have satisfactory efficiency and color saturation. Moreover, through the adjustment of the thickness of the second electrode layer, the number of times of using the FMM in the organic electroluminescence display panel may be reduced, so as to reduce the production costs and simplify the manufacturing process.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. An organic electroluminescence display panel comprising a plurality of first pixel areas, a plurality of second pixel areas, and a plurality of third pixel areas and further comprising:
   a first electrode layer comprising a reflective material;
   an organic layer, comprising:
      a light emitting layer made of organic light-emitting material located on the first electrode layer, wherein the light emitting layer comprises a first color light emitting material, a second color light emitting material, and a third color light emitting material; and
      a hole injection layer and a hole transport layer located between the first electrode layer and the light emitting layer, wherein a height and a thickness of the hole injection layer are the same in the first pixel areas, the second pixel areas, and the third pixel areas and a height and a thickness of the hole transport layer are the same in the first pixel areas, the second pixel areas, and the third pixel areas; and
   a second electrode layer located on the organic layer, wherein a material of the second electrode layer comprises a transparent metal oxide conductive material, and a thickness of the second electrode layer is a single thickness and is substantially greater than 300 nm, the thickness of the second electrode layer above the first, second, and third color light emitting materials is $L_E$, and the thickness $L_E$ satisfies a formula (1):

$$m_R - 0.2 \leq \frac{\psi}{2\pi} + \frac{2(n_O L_O + n_E L_E)}{\lambda_R} + \frac{1}{2} \leq m_R + 0.2 \quad \text{formula (1)}$$

$$m_G - 0.2 \leq \frac{\psi}{2\pi} + \frac{2(n_O L_O + n_E L_E)}{\lambda_G} + \frac{1}{2} \leq m_G + 0.2$$

$$m_B - 0.2 \leq \frac{\psi}{2\pi} + \frac{2(n_O L_O + n_E L_E)}{\lambda_B} + \frac{1}{2} \leq m_B + 0.2$$

wherein $n_E$ represents a refractive index of the second electrode layer, $\lambda_R$, $\lambda_G$, and $\lambda_B$ respectively represent a light emitting wavelength of the first pixel areas, the second pixel areas, and the third pixel areas, $\Psi$ represents a total amount of phase shift of light passing between the first electrode layer and the second electrode layer, the phase shift is measured in radians, $0 < \Psi \leq 2\Pi$, $m_R$, $m_G$, and $m_B$ respectively represent a positive integer, $n_O$ represents an average refractive index of the organic layer, and $L_O$ represents the thickness of the organic layer.

2. The organic electroluminescence display panel as recited in claim 1, wherein the thickness of the second electrode layer is from about 300 nm to about 700 nm.

3. The organic electroluminescence display panel as recited in claim 1, wherein $m_R \leq m_G \leq m_B$.

4. The organic electroluminescence display panel as recited in claim 1, wherein the first pixel areas, the second pixel areas, and the third pixel areas respectively emit red light, green light, and blue light, a wavelength of the red light is from about 590 nm to about 650 nm, a wavelength of the green light is from about 480 nm to about 540 nm, and a wavelength of the blue light is from about 420 nm to about 480 nm.

5. The organic electroluminescence display panel as recited in claim 1, wherein the first color light emitting material is in the first pixel areas, the second color light emitting material is in the second pixel areas, and the third color light emitting material is in the third pixel areas.

6. The organic electroluminescence display panel as recited in claim 5, wherein the first color light emitting material is a red light emitting material, the second color light emitting material is a green light emitting material, and the third color light emitting material is a blue light emitting material.

7. The organic electroluminescence display panel as recited in claim 1, wherein the first color light emitting material is in the first pixel areas, the second color light emitting material is in the second pixel areas, and the third color light emitting material is in the third pixel areas and covers the first color light emitting material and the second color light emitting material.

8. The organic electroluminescence display panel as recited in claim 7, wherein the first color light emitting material is a red light emitting material, the second color light emitting material is a green light emitting material, and the third color light emitting material is a blue light emitting material.

9. An organic electroluminescence display panel comprising a plurality of first pixel areas, a plurality of second pixel areas, and a plurality of third pixel areas and further comprising:
   a first electrode layer comprising a reflective material;
   an organic layer including a light emitting layer made of organic light-emitting material located on the first electrode layer; and
   a second electrode layer located on the organic layer, wherein a material of the second electrode layer comprises a transparent metal oxide conductive material, and a thickness of the second electrode layer is a single thickness and the thickness ranges from 501 nm to 700 nm.

10. An organic electroluminescence display panel comprising a plurality of first pixel areas, a plurality of second pixel areas, and a plurality of third pixel areas and further comprising:
   a first electrode layer comprising a reflective material;
   an organic layer, comprising:
      a light emitting layer made of organic light-emitting material located on the first electrode layer, wherein the light emitting layer comprises a first color light emitting material, a second color light emitting material, and a third color light emitting material, the first color light emitting material is in the first pixel areas, the second color light emitting material is in the second pixel areas, and the third color light emitting material is in the third pixel areas, the third color light emitting material covers and contacts the first color light emitting material and the second color light emitting material simultaneously, and the first color light emitting material is a red light emitting material, the second color light emitting material is a green light emitting material, and the third color light emitting material is a blue light emitting material;
   a hole injection layer and a hole transport layer located between the first electrode layer and the light emitting layer, wherein a height and a thickness of the hole injection layer are the same in the first pixel areas, the second pixel areas, and the third pixel areas and a height and a thickness of the hole transport layer are the same in the first pixel areas, the second pixel areas, and the third pixel areas; and
   a second electrode layer located on the organic layer, wherein a material of the second electrode layer comprises a transparent metal oxide conductive material, and a thickness of the second electrode layer is a single thickness and is substantially greater than 300 nm.

11. The organic electroluminescence display panel as recited in claim 9, wherein
   the light emitting layer of the organic layer comprises a first color light emitting material and a second color light emitting material, the first color light emitting material is in the first pixel areas and the second pixel areas, the second color light emitting material is in the third pixel areas,
   the organic electroluminescence display panel further comprises a color filter layer located on the second electrode layer, the color filter layer comprises a third color filter material and a fourth color filter material, the third color filter material is in the first pixel areas, and the fourth color filter material is in the second pixel areas.

* * * * *